United States Patent
Lai

(10) Patent No.: US 7,978,809 B2
(45) Date of Patent: Jul. 12, 2011

(54) SHIFT REGISTER OF A DISPLAY DEVICE

(75) Inventor: Wei-Jen Lai, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/565,767

(22) Filed: Sep. 24, 2009

(65) Prior Publication Data

US 2010/0316182 A1    Dec. 16, 2010

(30) Foreign Application Priority Data

Jun. 10, 2009    (TW) ................................ 98119353 A

(51) Int. Cl.
    *G11C 19/00* (2006.01)
(52) U.S. Cl. ................................ 377/64; 377/78; 377/79
(58) Field of Classification Search ........................ None
    See application file for complete search history.

(56) References Cited

U.S. PATENT DOCUMENTS

| | | | | |
|---|---|---|---|---|
| 7,203,264 | B2 * | 4/2007 | Lo et al. | 377/64 |
| 7,436,923 | B2 * | 10/2008 | Tobita | 377/64 |
| 7,664,218 | B2 * | 2/2010 | Tobita | 377/64 |
| 2005/0220262 | A1 * | 10/2005 | Moon | 377/64 |
| 2008/0056430 | A1 | 3/2008 | Chang et al. | |
| 2008/0101529 | A1 * | 5/2008 | Tobita | 377/64 |
| 2009/0303211 | A1 * | 12/2009 | Hu | 345/204 |
| 2010/0054392 | A1 * | 3/2010 | Chen et al. | 377/79 |
| 2010/0150301 | A1 * | 6/2010 | Chan et al. | 377/64 |

FOREIGN PATENT DOCUMENTS

| | | |
|---|---|---|
| CN | 1588555 A | 3/2005 |
| CN | 101122720 A | 2/2008 |
| CN | 101369460 | 2/2009 |
| CN | 101465165 A | 6/2009 |

* cited by examiner

*Primary Examiner* — Tuan Lam

(74) *Attorney, Agent, or Firm* — Winston Hsu; Scott Margo

(57) ABSTRACT

A shift register includes a plurality of shift register units each including an input circuit, a pull-up circuit and a pull-down circuit. The shift register unit receives an input voltage at an input end and provides an output voltage at an output end. The input circuit controls the signal transmission path between a first clock signal and a first node according to the input voltage. The pull-up circuit controls the signal transmission path between a second clock signal and the output end according to the level of the first node. The pull-down circuit includes a pull-down unit and a control unit. The pull-down unit maintains the level of the first node or the output end according to the level of the second node. The control unit maintains the level of the second node according to the first clock signal, the second clock signal and the level of the first node.

9 Claims, 10 Drawing Sheets

SHIFT REGISTER OF A DISPLAY DEVICE

BACKGROUND OF THE INVENTION

1. Field of the Invention

The present invention is related to a shift register, and more particularly, to a shift register of a liquid crystal display device.

2. Description of the Prior Art

Liquid crystal display (LCD) devices, characterized in low radiation, thin appearance and low power consumption, have gradually replaced traditional cathode ray tube display (CRT) devices and been widely used in electronic devices such as notebook computers, personal digital assistants (PDAs), flat panel TVs or mobile phones. Traditional LCD devices display image by driving the pixels of the LCD panel using external driving chips. In order to reduce the number of devices and manufacturing costs, GOA (gate on array) technique has been developed in which the gate driver is directly fabricated on the LCD panel.

Reference is made to FIG. 1 for a simplified block diagram of a prior art LCD device 100. FIG. 1 only illustrates partial structure of the LCD device 100, including a plurality of gate lines GL(1)-GL(N), a shift register 110, a clock generator 120, and a power supply 130. For operating the shift register 110, the clock generator 120 provides a start pulse signal VST and two clock signals CK and XCK, while the power supply 130 provides a bias voltage VSS. The clock signals CK and XCK periodically switch between a high voltage level and a low voltage level and have opposite polarities at the same time. The shift register 110 includes a plurality of shift register units SR(1)-SR(N) coupled in series. Each shift register unit is coupled to a corresponding gate line, a first input end IN1 of a next-stage shift register unit, and a second input end IN2 of a prior-stage shift register unit. According to the clock signals CK, XCK and the start pulse signal VST, the shift register 110 can sequentially output gate driving signals GS(1)-GS(N) to the corresponding gate lines GL(1)-GL(N) using the shift register units SR(1)-SR(N), respectively.

Reference is made to FIG. 2 for a diagram illustrating an nth-stage shift register unit SR(n) of the LCD device 100 (n is an integer between 1 and N). The shift register unit SR(n) includes an first input end IN1, a second input end IN2, an output end OUT, a node Q(n), an input circuit 10, a pull-up circuit 20, a pull-down circuit 30, and a maintain circuit 40. The first input end IN1 of the shift register unit SR(n) is coupled to the output end of the (n−1)th shift register unit SR(n−1), the second input end IN2 of the shift register unit SR(n) is coupled to the output end of the (n+1)th shift register unit SR(n+1), and the output end OUT of the shift register unit SR(n) is coupled to the first input end of the (n+1)th shift register unit SR(n+1) and the gate line GL(n). In the prior art LCD device 100, the transistor switch T1 of the input circuit 10 maintains the voltage level of the node Q(n) according to the (n−1)th-stage gate driving signal GS(n−1), the transistor switches T2 and T3 of the pull-up circuit 20 output the gate driving signal GS(n) respectively according to the voltage level of the node Q(n) and the (n+1)th-stage gate driving signal GS(n+1), the transistor switch T4 of the pull-down circuit 30 maintains the voltage level of the node Q(n) according to the (n+1)th-stage gate driving signal GS(n+1), and the transistor T5 of the maintain circuit 40 controls the signal transmission path between the node Q(n) and the output end OUT according to the clock signal CK. Since the (n+1)th-stage gate driving signal GS(n+1) is required for maintaining the voltage level of the node Q(n), the prior art LCD device 100 has complicated circuit layout and fails to stabilize the voltage level of the output end OUT effectively.

Reference is made to FIG. 3 for a simplified block diagram of a prior art LCD device 200. FIG. 2 only illustrates partial structure of the LCD device 200, including a plurality of gate lines GL(1)-GL(N), a shift register 210, a clock generator 220, and a power supply 230. For operating the shift register 210, the clock generator 220 provides a start pulse signal VST and two clock signals CK and XCK, while the power supply 230 provides bias voltages VDD and VSS. The clock signals CK and XCK periodically switch between a high voltage level and a low voltage level and have opposite polarities at the same time. The shift register 210 includes a plurality of shift register units SR(1)-SR(N) coupled in series. Each shift register unit is coupled to a corresponding gate line and a next-stage shift register unit. According to the clock signals CK, XCK and the start pulse signal VST, the shift register 210 can sequentially output gate driving signals GS(1)-GS(N) to the corresponding gate lines GL(1)-GL(N) using the shift register units SR(1)-SR(N), respectively.

Reference is made to FIG. 4 for a diagram illustrating an nth-stage shift register unit SR(n) of the LCD device 200 (n is an integer between 1 and N). The shift register unit SR(n) includes an input end IN(n), an output end OUT(n), an input circuit 10, a pull-up circuit 20, and a pull-down circuit 30. The input end IN(n) of the shift register unit SR(n) is coupled to the (n−1)th shift register unit SR(n−1), while the output end OUT(n) of the shift register unit SR(n) is coupled to the (n+1)th shift register unit SR(n+1) and the gate line GL(n). In the prior art LCD device 200, the transistor switch T1 of the input circuit 10 maintains the voltage level of the node Q(n) according to the gate driving signal GS(n−1), the transistor switches T2 and T3 of the pull-up circuit 20 output the gate driving signal GS(n) respectively according to the voltage levels of the nodes $Q1(n)$ and $Q2(n)$, the transistor switches T4-T6 of the pull-down circuit 30 maintain the voltage levels of the nodes $Q1(n)$ and $Q2(n)$. Although the (n+1)th-stage gate driving signal GS(n+1) is not required as a feedback signal, the prior art LCD device 200 still has a complicated circuit layout.

SUMMARY OF THE INVENTION

The present invention provides a shift register comprising a plurality of shift register units coupled in series. Each shift register unit comprises an input end for receiving an input voltage, an output end for outputting an output voltage, a first node, a second node, an input circuit, a pull-up circuit, and a pull-down circuit. The input circuit controls a signal transmission path between a first clock signal and the first node according to a voltage level of the input voltage. The pull-up circuit provides the output voltage by controlling a signal transmission path between a second clock signal and the output node according to a voltage level of the first node, wherein the first and second clock signals periodically switch between a high voltage level and a low voltage level, and have opposite polarities in a same period. The pull-down circuit comprises a pull-down unit for maintaining the voltage level of the first node or the output end according to a voltage level of the second node and a control unit for maintaining the voltage level of the second node according to the first clock signal, the second clock signal and the voltage level of the second node.

The present invention also provides shift register comprising a plurality of shift register units coupled in series. Each shift register unit comprises an input end for receiving an input voltage, an output end for outputting an output voltage, a first node, a second node, an input circuit, a pull-up circuit, and a pull-down circuit. The input circuit controls a signal transmission path between a first clock signal and the first node according to a voltage level of the input voltage. The pull-up circuit provides the output voltage by controlling a signal transmission path between a second clock signal and the output node according to a voltage level of the first node, wherein the first and second clock signals periodically switch between a high voltage level and a low voltage level, and have opposite polarities in a same period. The pull-down circuit comprises a pull-down unit for maintaining the voltage level of the first node or the output end according to a voltage level of the second node and a control unit for maintaining the voltage level of the second node according to a first bias voltage and the voltage level of the first node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
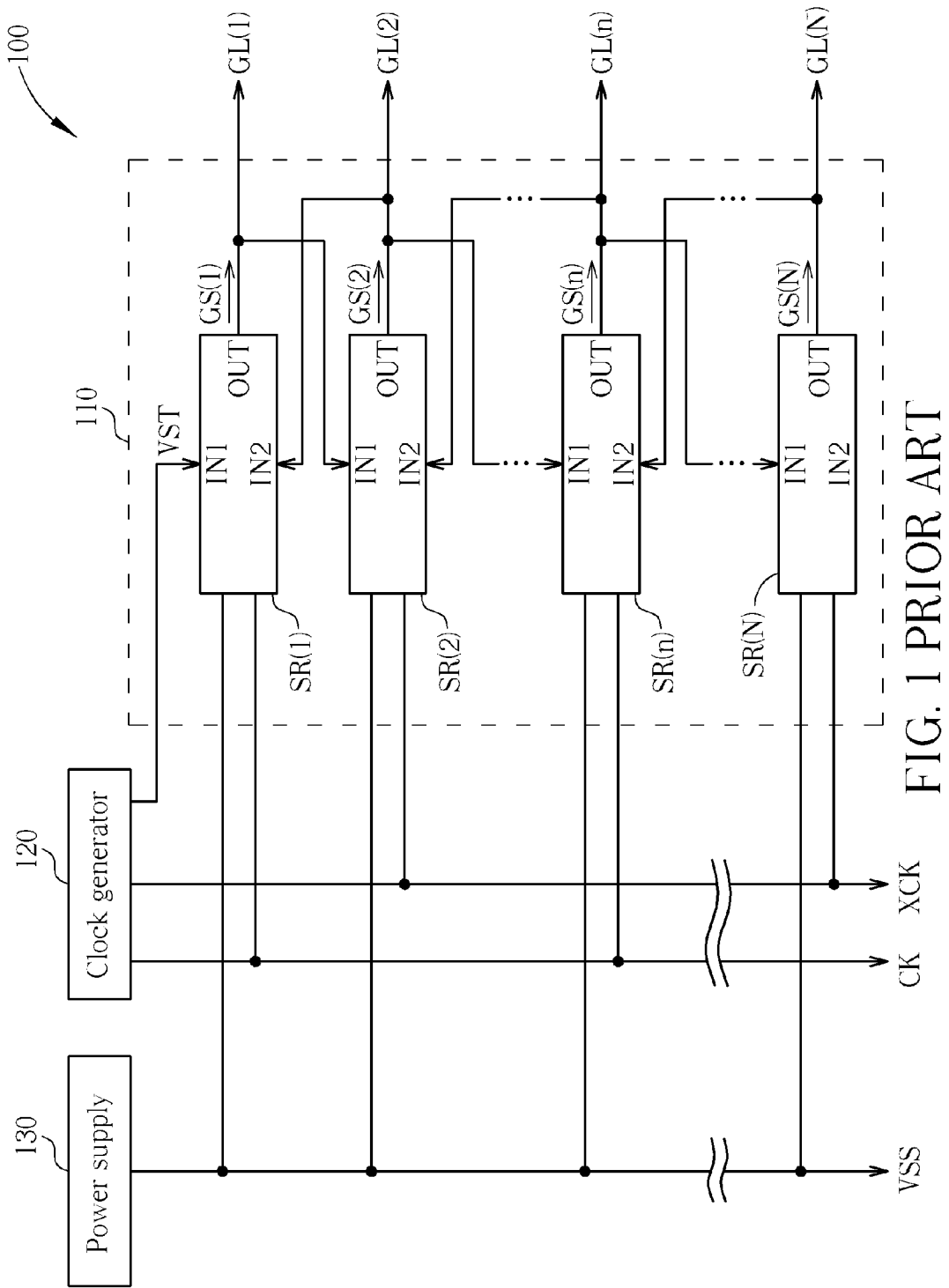
FIG. 1 is a simplified block diagram of a prior art LCD device.
Figure 2:
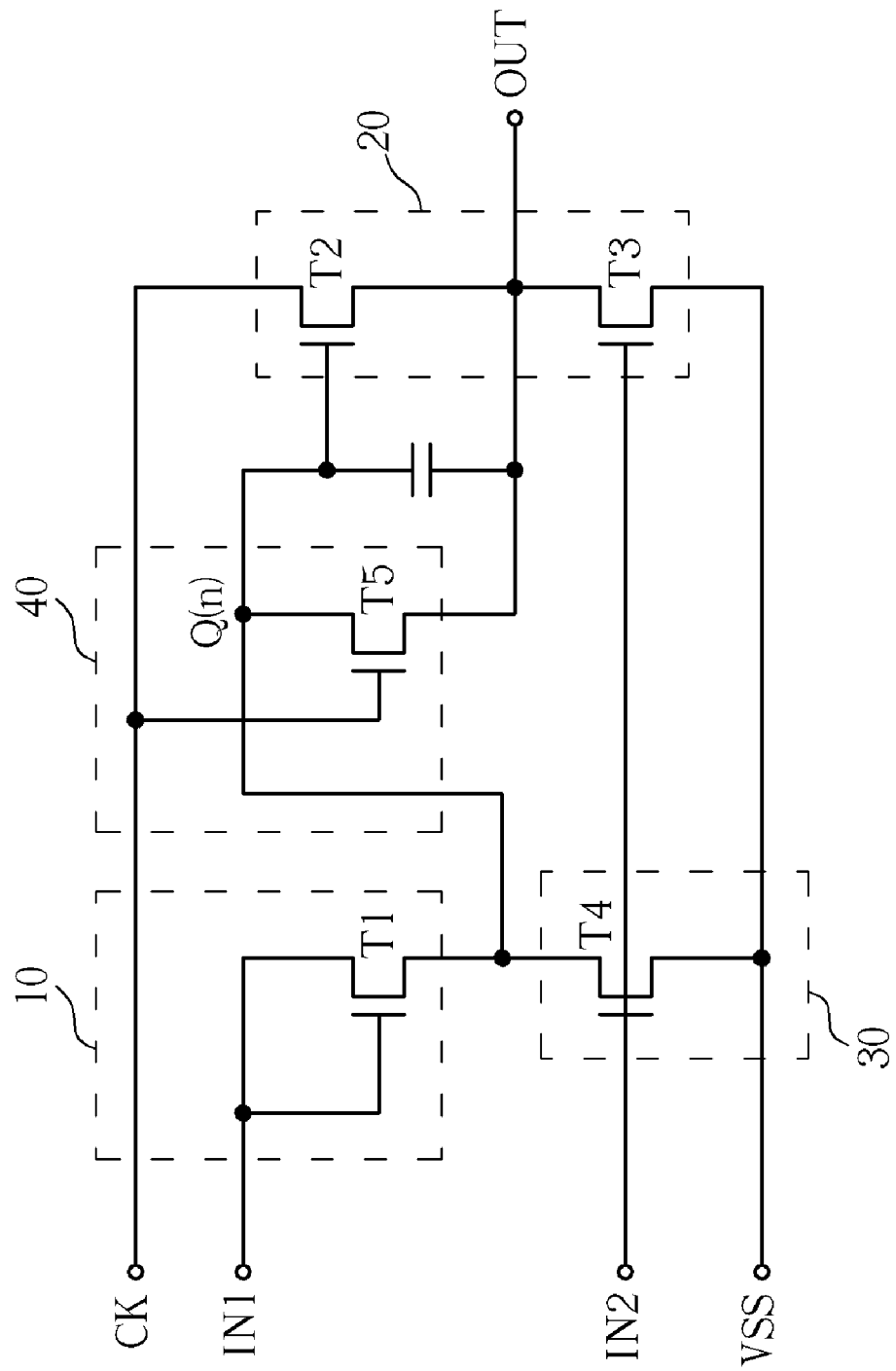
FIG. 2 is a diagram illustrating an nth-stage shift register unit of the LCD device in FIG. 1.
Figure 3:
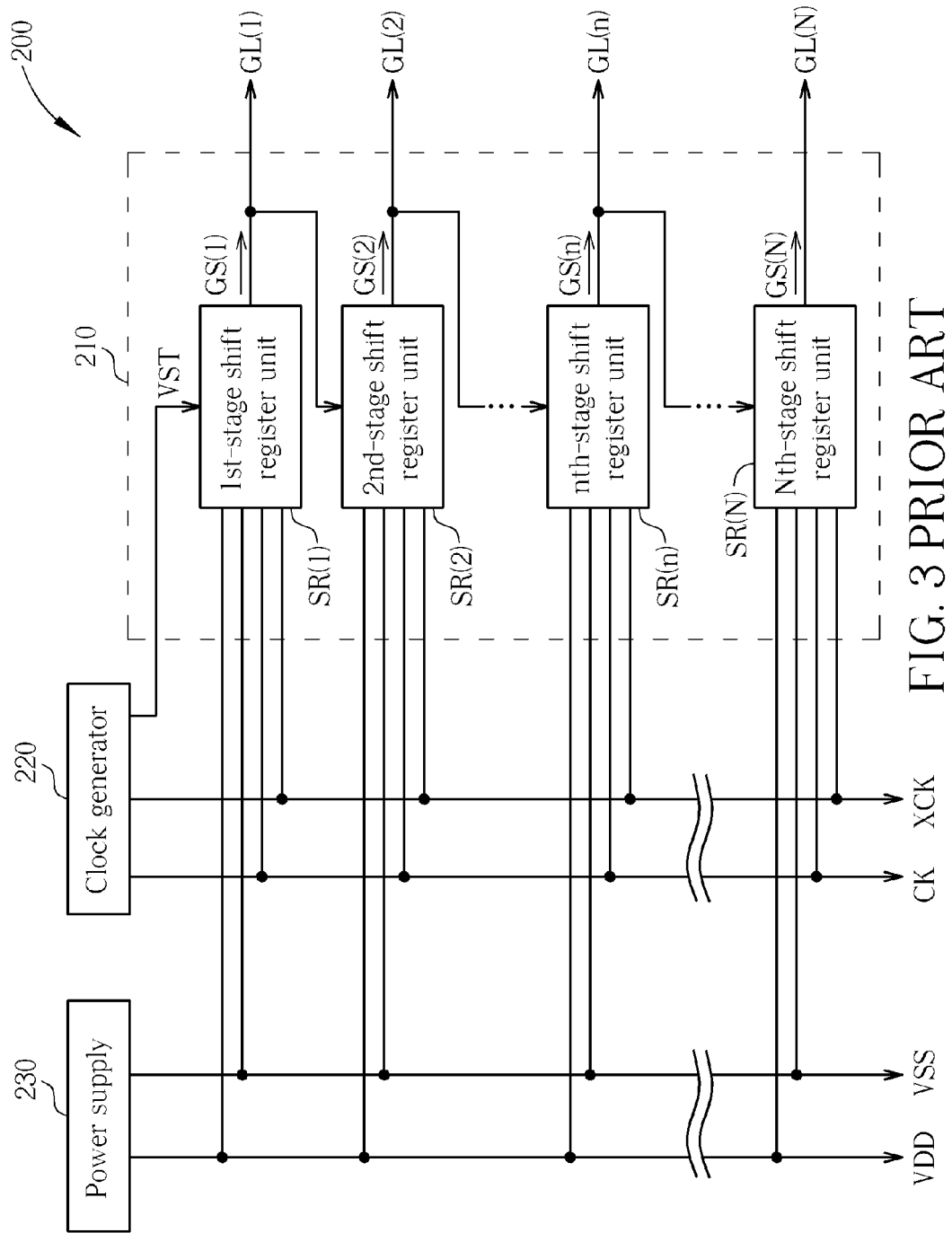
FIG. 3 is a simplified block diagram of another prior art LCD device.
Figure 4:
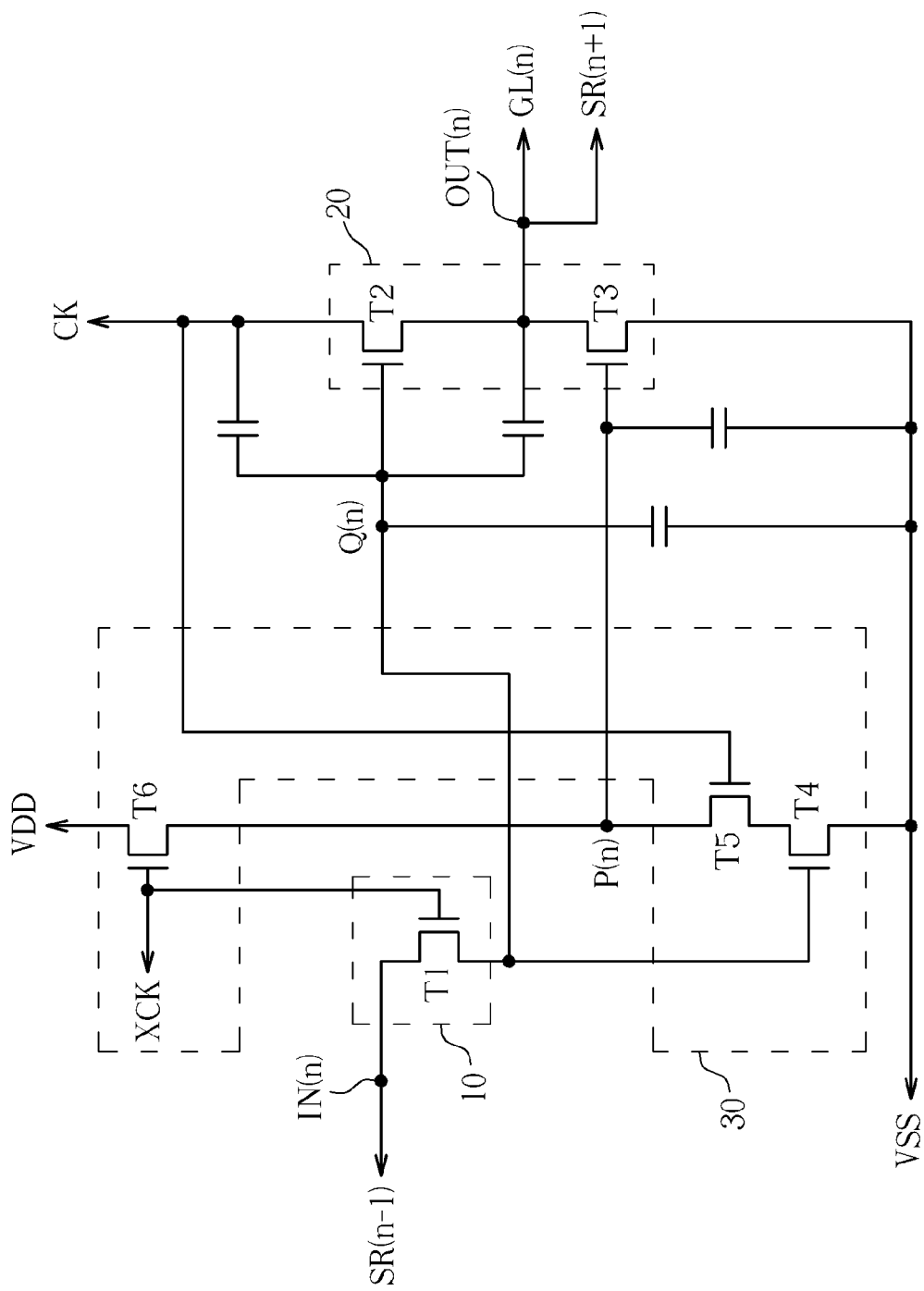
FIG. 4 is a diagram illustrating an nth-stage shift register unit of the LCD device in FIG. 3.
Figure 5:
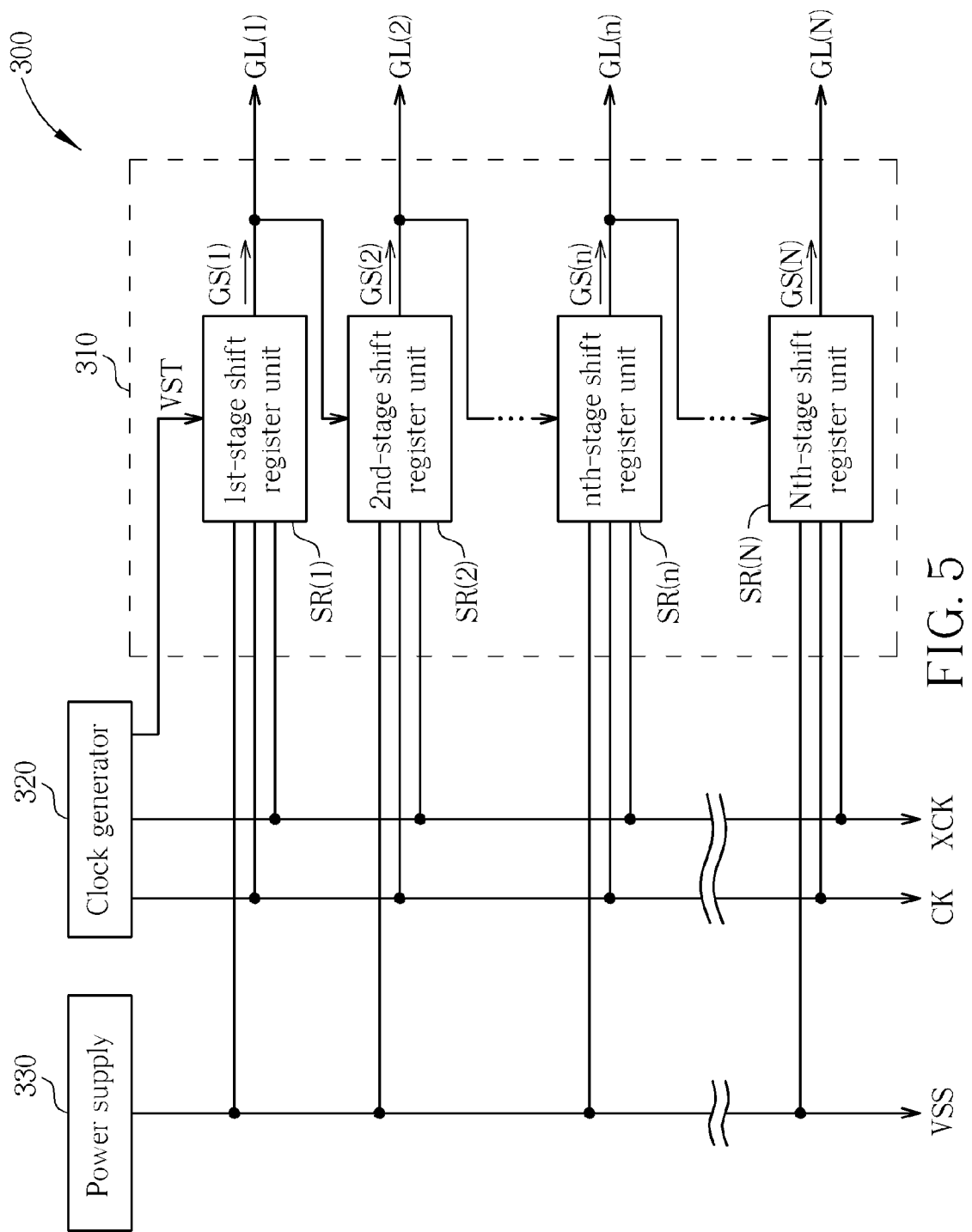
FIG. 5 is a simplified block diagram of an LCD device according to the present invention.

Reference is made to FIG. 5 for a simplified block diagram of an LCD device 300 according to the present invention. FIG. 5 only illustrates partial structure of the LCD device 300, including a plurality of gate lines GL(1)-GL(N), a shift register 310, a clock generator 320, and a power supply 330. For operating the shift register 310, the clock generator 320 provides a start pulse signal VST and two clock signals CK and XCK, while the power supply 330 provides a bias voltage VSS. The clock signals CK and XCK periodically switch between a high voltage level and a low voltage level and have opposite polarities at the same time. The shift register 310 includes a plurality of shift register units SR(1)-SR(N) coupled in series. Each shift register unit is coupled to a corresponding gate line and the input end of a next-stage shift register unit. According to the clock signals CK, XCK and the start pulse signal VST, the shift register 310 can sequentially output gate driving signals GS(1)-GS(N) to the corresponding gate lines GL(1)-GL(N) using the shift register units SR(1)-SR(N), respectively.

Figure 6:
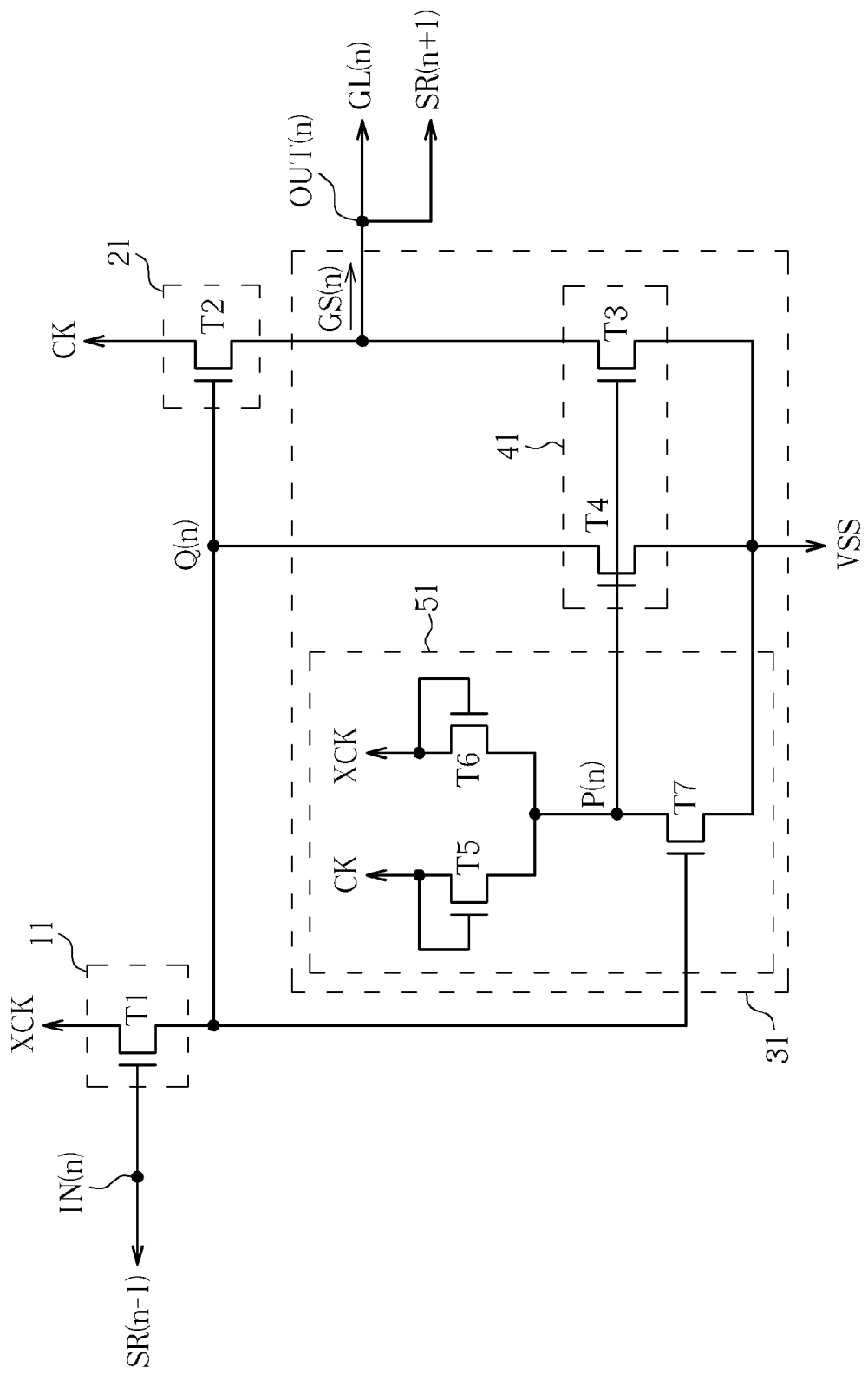
FIG. 6 is a diagram illustrating an nth-stage shift register unit according to the first embodiment of the present invention.

Reference is made to FIG. 6 for a diagram illustrating an nth-stage shift register unit SR(n) of the LCD device 300 according to the first embodiment of the present invention (n is an integer between 1 and N). The shift register unit SR(n) includes an input end IN(n), an output end OUT(n), nodes Q(n) and P(n), an input circuit 11, a pull-up circuit 21, and a pull-down circuit 31. The input end IN(n) of the shift register unit SR(n) is coupled to the (n−1)th-stage shift register unit SR(n−1), while the output end OUT(n) of the shift register unit SR(n) is coupled to the (n+1)th-stage shift register unit SR(n+1) and the gate line GL(n).

The input circuit 11 includes a transistor switch T1 having a gate terminal coupled to the input end IN(n) of the shift register unit SR(n), a drain terminal coupled to the clock generator 320 for receiving the clock signal XCK, and a source terminal coupled to the node Q(n). The pull-up circuit 21 includes a transistor switch T2 having a gate terminal coupled to the node Q(n), a drain terminal coupled to the clock generator 320 for receiving the clock signal CK, and a source terminal coupled to the output end OUT(n) of the shift register unit SR(n). Therefore, the input circuit 11 can control the signal transmission path between the clock signal XCK and the node Q(n) according to the gate driving signal GS(n−1), while the pull-up circuit 21 can control the signal transmission path between the clock signal CK and the output end OUT(n) according to the voltage level of the node Q(n).

The pull-down circuit 31 includes a pull-down unit 41 and a control unit 51. The pull-down unit 41 maintains the voltage level of the node Q(n) or the output end OUT(n) according to the voltage level of the node P(n), while the control unit 51 maintains the voltage level of the node P(n) according to the voltage level of the clock signal XCK and the node Q(n). In the pull-down circuit 31 according to the first embodiment of the present invention, the pull-down unit 41 includes transistor switches T3 and T4: with a gate terminal coupled to the node P(n), a drain terminal coupled to the output end OUT(n), and a source terminal coupled to the power supply 330 for receiving the bias voltage VSS, the transistor switch T3 maintains the voltage level of the output end OUT(n) according to the voltage level of the node P(n); with a gate terminal coupled to the node P(n), a drain terminal coupled to the node Q(n), and a source terminal coupled to the power supply 330 for receiving the bias voltage VSS, the transistor switch T4 maintains the voltage level of the node Q(n) according to the voltage level of the node P(n). On the other hand, the control unit 51 includes transistor switches T5-T7: with a gate terminal and a drain terminal coupled to the clock generator 320 for receiving the clock signal CK, and a source terminal coupled to the node P(n), the transistor switch T5 maintains the voltage level of the node P(n) according to the clock signal CK; with a gate terminal and a drain terminal coupled to the clock generator 320 for receiving the clock signal XCK, and a source terminal coupled to the node P(n), the transistor switch T6 maintains the voltage level of the node P(n) according to the clock signal XCK; with a gate terminal coupled to the node Q(n), a drain terminal coupled to the node P(n), and a source terminal coupled to the power supply 330 for receiving the bias voltage VSS, the transistor switch T7 maintains the voltage level of the node P(n) according to the voltage level of the node Q(n).

Except during the nth-stage output period, the shift register unit SR(n) outputs the low level gate driving signal GS(n). The node Q(n) needs to be kept at low level for turning off the transistor switch T2, so that the clock signal CK does not influence the voltage level of the gate driving signal GS(n). Assuming the duty cycle of both clock signals CK and XCK is ½, the transistor switches T5 and T6 of the control unit 51 each perform 50% of the pull-down operation. The pull-down operation is performed by the transistor switch T5 when the clock signal CK is at high level. The transistor switch T5 is turned on and the transistor switch T6 is turned off, thereby pulling up the node P(n) to the high voltage level of the clock signal CK via the turned-on transistor T5. Therefore, the transistor switches T3 and T4 can be turned on for respectively pulling down the output end OUT(n) and the node Q(n) to the low level bias voltage VSS. On the other hand, the pull-down operation is performed by the transistor switch T6 when the clock signal XCK is at high level. The transistor switch T6 is turned on and the transistor switch T5 is turned off, thereby pulling up the node P(n) to the high voltage level of the clock signal XCK via the turned-on transistor T6. Therefore, the transistor switches T3 and T4 can be turned on for respectively pulling down the output end OUT(n) and the node Q(n) to the low level bias voltage VSS.

During the nth-stage output period, the node Q(n) needs to be kept at high level so that the transistor switch T2 can be turned on for outputting the high level gate driving signal GS(n). Prior to the nth-stage output period of the shift register unit SR(n), the transistor switch T1 of the input circuit 11 is turned on by the high level gate driving signal GS(n−1) of the (n−1)th-stage output period, thereby pulling up the node Q(n) to the high voltage level of the clock signal XCK. Meanwhile, the transistor switch T7 of the control unit 51 is also turned on, thereby pulling down the node P(n) to the low level bias voltage VSS. By turning off the transistor switches T3 and T4, the pull-down operation can be terminated.

Figure 7:
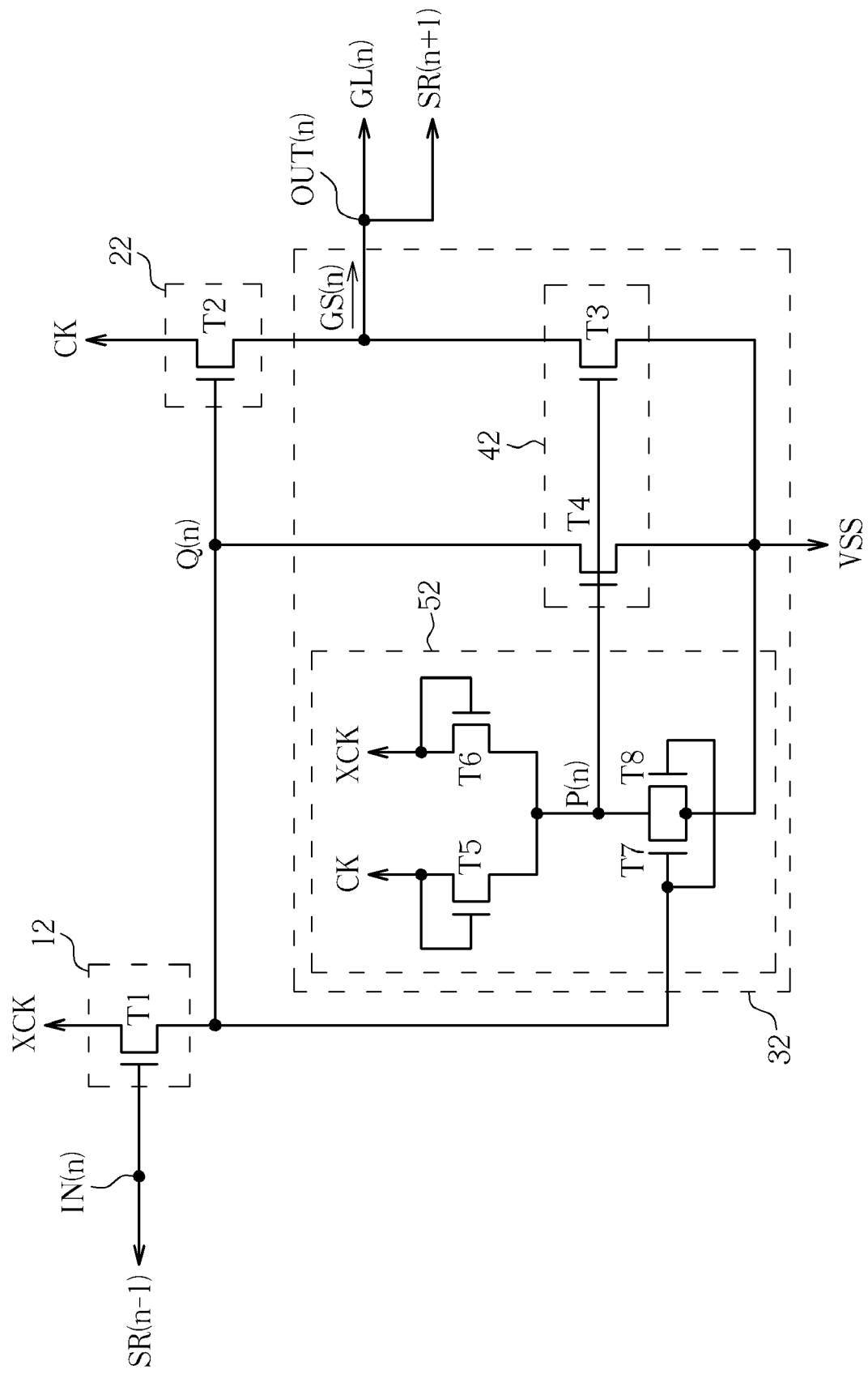
FIG. 7 is a diagram illustrating an nth-stage shift register unit according to the second embodiment of the present invention.

Reference is made to FIG. 7 for a diagram illustrating an nth-stage shift register unit SR(n) of the LCD device 300 according to the second embodiment of the present invention (n is an integer between 1 and N). The shift register unit SR(n) includes an input end IN(n), an output end OUT(n), nodes Q(n) and P(n), an input circuit 12, a pull-up circuit 22, and a pull-down circuit 32. The input circuit 12 and the pull-up circuit 22 in the second embodiment of the present invention are similar to the input circuit 11 and the pull-up circuit 21 in the first embodiment of the present invention. However, the second embodiment differs from the first embodiment in the pull-down circuit 32. The pull-down circuit 32 according to the second embodiment of the present invention includes a pull-down unit 42 and a control unit 52. The pull-down unit 42, including transistor switches T3 and T4, maintains the voltage level of the node Q(n) or the output end OUT(n) according to the voltage level of the node P(n). The control unit 52 includes transistor switches T5-T8: the transistor switches T5 and T6 maintain the voltage level of the node P(n) according to the voltage level of the clock signals CK and XCK, while the transistor switches T7 and T8 maintain the voltage level of the node P(n) according to the voltage level of the node Q(n). Since the transistor switches T7 and T8 coupled in parallel provide better driving ability, the LCD device 300 according to the second embodiment of the present invention can thus perform the pull-down operation more efficiently.

Figure 8:
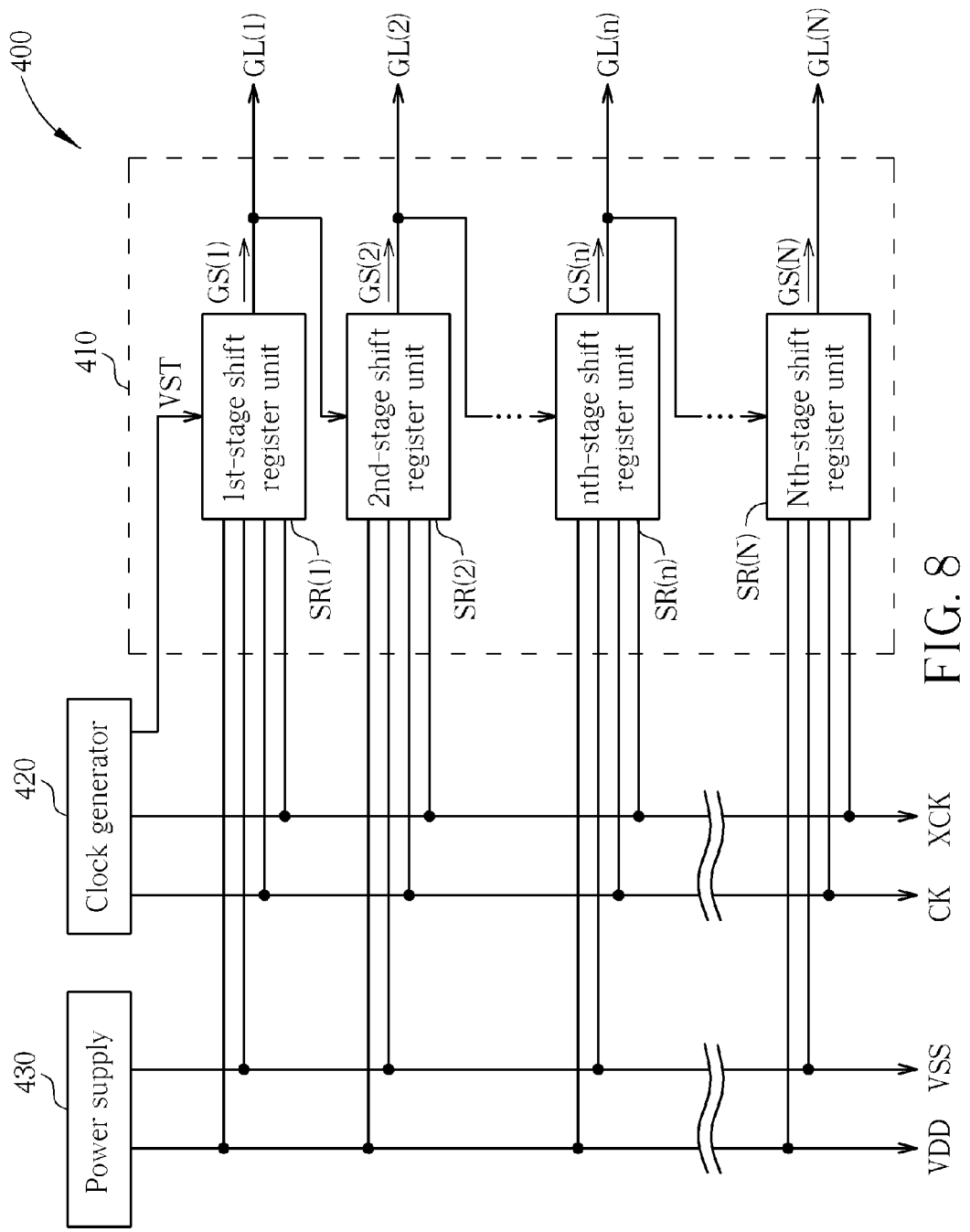
FIG. 8 is a simplified block diagram of another LCD device according to the present invention.

Reference is made to FIG. 8 for a simplified block diagram of an LCD device 400 according to the present invention. FIG. 8 only illustrates partial structure of the LCD device 400, including a plurality of gate lines GL(1)-GL(N), a shift register 410, a clock generator 420, and a power supply 430. For operating the shift register 410, the clock generator 420 provides a start pulse signal VST and two clock signals CK and XCK, while the power supply 430 provides bias voltages VDD and VSS. The clock signals CK and XCK periodically switch between a high voltage level and a low voltage level and have opposite polarities at the same time. The shift register 410 includes a plurality of shift register units SR(1)-SR(N) coupled in series. Each shift register unit is coupled to a corresponding gate line and the input end of a next-stage shift register unit. According to the clock signals CK, XCK and the start pulse signal VST, the shift register 410 can sequentially output gate driving signals GS(1)-GS(N) to the corresponding gate lines GL(1)-GL(N) using the shift register units SR(1)-SR(N), respectively.

Figure 9:
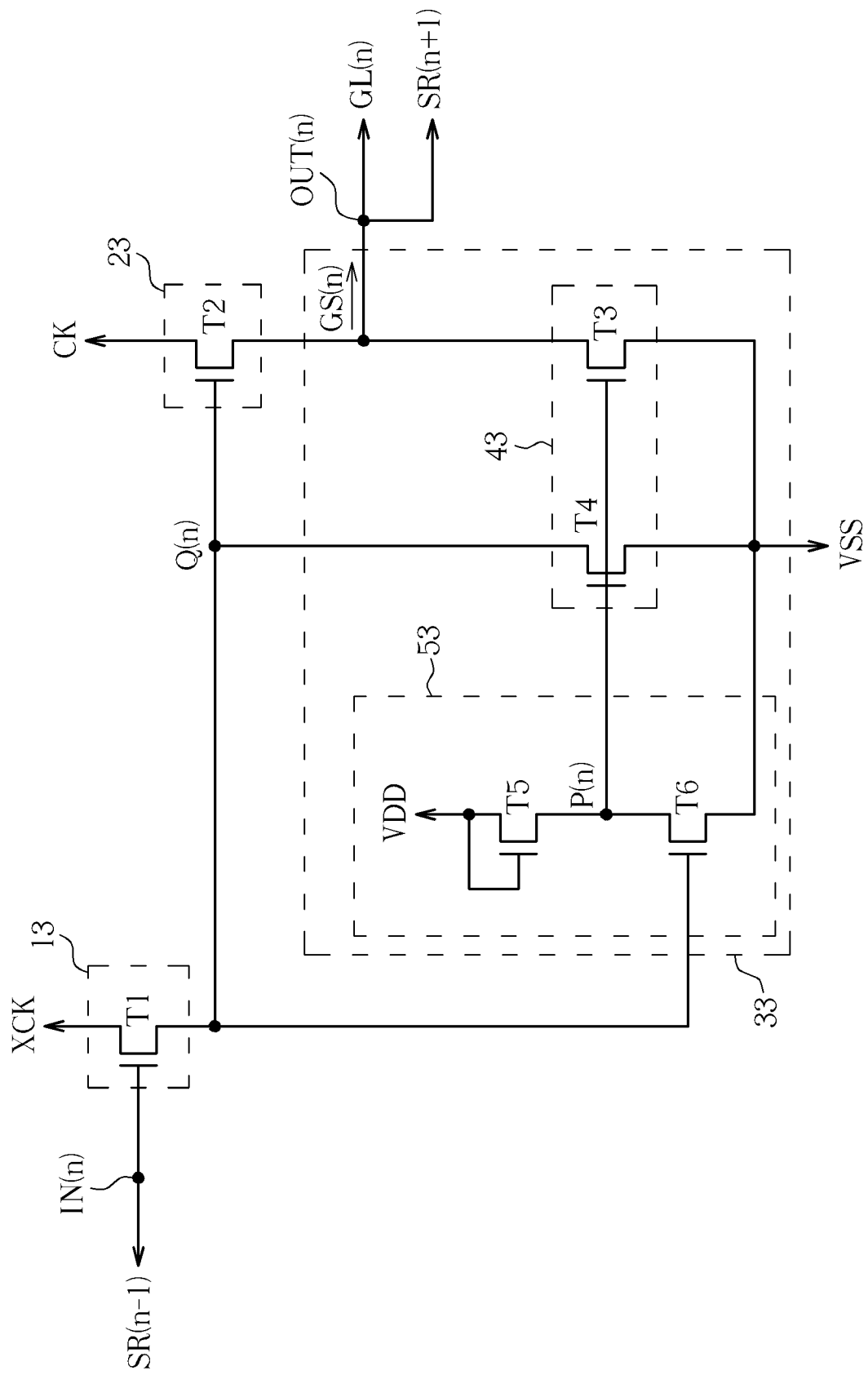
FIG. 9 is a diagram illustrating an nth-stage shift register unit according to the third embodiment of the present invention.

Reference is made to FIG. 9 for a diagram illustrating an nth-stage shift register unit SR(n) of the LCD device 400 according to the third embodiment of the present invention (n is an integer between 1 and N). The shift register unit SR(n) includes an input end IN(n), an output end OUT(n), nodes Q(n) and P(n), an input circuit 13, a pull-up circuit 23, and a pull-down circuit 33. The input end IN(n) of the shift register unit SR(n) is coupled to the (n−1)th-stage shift register unit SR(n−1), while the output end OUT(n) of the shift register unit SR(n) is coupled to the (n+1)th-stage shift register unit SR(n+1) and the gate line GL(n).

The input circuit 13 includes a transistor switch T1 having a gate terminal coupled to the input end IN(n) of the shift register unit SR(n), a drain terminal coupled to the clock generator 420 for receiving the clock signal XCK, and a source terminal coupled to the node Q(n). The pull-up circuit 23 includes a transistor switch T2 having a gate terminal coupled to the node Q(n), a drain terminal coupled to the clock generator 420 for receiving the clock signal CK, and a source terminal coupled to the output end OUT(n) of the shift register unit SR(n). Therefore, the input circuit 13 can control the signal transmission path between the clock signal XCK and the node Q(n) according to the gate driving signal GS(n−1), while the pull-up circuit 23 can control the signal transmission path between the clock signal CK and the output end OUT(n) according to the voltage level of the node Q(n).

The pull-down circuit 33 includes a pull-down unit 43 and a control unit 53. The pull-down unit 43 maintains the voltage level of the node Q(n) or the output end OUT(n) according to the voltage level of the node P(n), while the control unit 53 maintains the voltage level of the node P(n) according to the voltage level of the clock signal XCK and the node Q(n). In the pull-down circuit 33 according to the third embodiment of the present invention, the pull-down unit 43 includes transistor switches T3 and T4: with a gate terminal coupled to the node P(n), a drain terminal coupled to the output end OUT(n), and a source terminal coupled to the power supply 430 for receiving the bias voltage VSS, the transistor switch T3 maintains the voltage level of the output end OUT(n) according to the voltage level of the node P(n); with a gate terminal coupled to the node P(n), a drain terminal coupled to the node Q(n), and a source terminal coupled to the power supply 430 for receiving the bias voltage VSS, the transistor switch T4 maintains the voltage level of the node Q(n) according to the voltage level of the node P(n). On the other hand, the control unit 53 includes transistor switches T5 and T6: with a gate terminal and a drain terminal coupled to the power supply for receiving the bias voltage VDD, and a source terminal coupled to the node P(n), the transistor switch T5 maintains the voltage level of the node P(n) according to the bias voltage VDD; with a gate terminal coupled to the node Q(n), a drain terminal coupled to the node P(n), and a source terminal coupled to the power supply 430 for receiving the bias voltage VSS, the transistor switch T6 maintains the voltage level of the node P(n) according to the voltage level of the node Q(n).

Except during the nth-stage output period, the shift register unit SR(n) outputs the low level gate driving signal GS(n). The node Q(n) needs to be kept at low level for turning off the transistor switch T2, so that the clock signal CK does not influence the voltage level of the gate driving signal GS(n). The transistor switch T5 of the control unit 53 performs the pull-down operation by pulling up the node P(n) to the high level bias voltage VDD via the turned-on transistor T5. During the nth-stage output period, the node Q(n) needs to be kept at high level so that the transistor switch T2 can be turned on for outputting the high level gate driving signal GS(n). Prior to the nth-stage output period of the shift register unit SR(n), the transistor switch T1 of the input circuit 13 is turned on by the high level gate driving signal GS(n−1) of the (n−1)th-stage output period, thereby pulling up the node Q(n) to the high voltage level of the clock signal XCK. Meanwhile, the transistor switch T6 of the pull-down unit 43 is also turned on, thereby pulling down the node P(n) to the low level bias voltage VSS. By turning off the transistor switches T3 and T4, the pull-down operation can be terminated.

Figure 10:
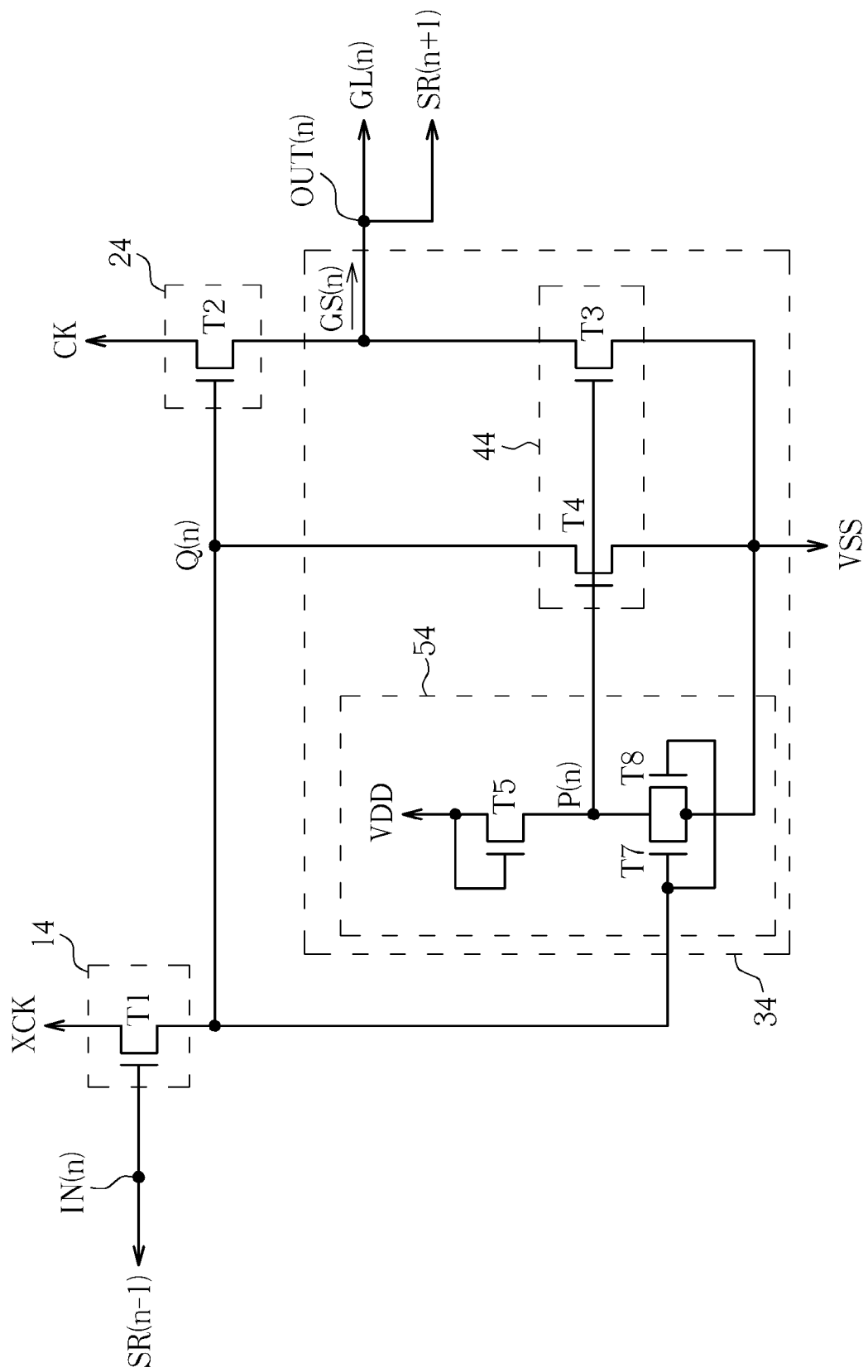
FIG. 10 is a diagram illustrating an nth-stage shift register unit according to the fourth embodiment of the present invention.

Reference is made to FIG. 10 for a diagram illustrating an nth-stage shift register unit SR(n) of the LCD device 300 according to the fourth embodiment of the present invention (n is an integer between 1 and N). The shift register unit SR(n) includes an input end IN(n), an output end OUT(n), nodes Q(n) and P(n), an input circuit 14, a pull-up circuit 24, and a pull-down circuit 34. The input circuit 14 and the pull-up circuit 24 in the fourth embodiment of the present invention are similar to the input circuit 13 and the pull-up circuit 23 in the third embodiment of the present invention. However, the fourth embodiment differs from the third embodiment in the pull-down circuit 34. The pull-down circuit 34 according to the fourth embodiment of the present invention includes a pull-down unit 44 and a control unit 54. The pull-down unit 44, including transistor switches T3 and T4, maintains the voltage level of the node Q(n) or the output end OUT(n) according to the voltage level of the node P(n). The control unit 54 includes transistor switches T5-T8: the transistor switches T5 and T6 maintain the voltage level of the node P(n) according to the voltage level of the clock signals CK and XCK, while the transistor switches T7 and T8 maintain the voltage level of the node P(n) according to the voltage level of the node Q(n). Since the transistor switches T7 and T8 coupled in parallel provide better driving ability, the LCD device 300 according to the fourth embodiment of the present invention can thus perform the pull-down operation more efficiently.

In the embodiments of the present invention, the transistor switches can be thin film transistor (TFT) switches or other devices having similar function. In the LCD device according to the present invention, the pull-down operation can be performed by the pull-down circuit having fewer devices, which simplifies circuit layout and provides efficient voltage stabilization.

Those skilled in the art will readily observe that numerous modifications and alterations of the device and method may be made while retaining the teachings of the invention.

What is claimed is:

1. A shift register comprising a plurality of shift register units coupled in series, each shift register unit comprising:
   an input end for receiving an input voltage;
   an output end for outputting an output voltage;
   a first node;
   a second node;
   an input circuit for controlling a signal transmission path between a first clock signal and the first node according to a voltage level of the input voltage;
   a pull-up circuit for providing the output voltage by controlling a signal transmission path between a second clock signal and the output node according to a voltage level of the first node, wherein the first and second clock signals periodically switch between a high voltage level and a low voltage level, and have opposite polarities in a same period; and
   a pull-down circuit comprising:
      a pull-down unit having a fourth switch for maintaining the voltage level of the first node or the output end according to a voltage level of the second node, the fourth switch including:
         a first end coupled to the first node;
         a second end for receiving a bias voltage; and
         a control end coupled to the second node; and
      a control unit for maintaining the voltage level of the second node according to the first clock signal, the second clock signal and the voltage level of the first node.

2. The shift register of claim 1 wherein the input circuit comprises:
   a first switch including:
      a first end for receiving the first clock signal;
      a second end coupled to the first node; and
      a control end coupled to the input end of the shift register unit.

3. The shift register of claim 1 wherein the pull-up circuit comprises:
   a second switch including:
      a first end for receiving the second clock signal;
      a second end coupled to the output end; and
      a control end coupled to the first node.

4. The shift register of claim 1 wherein the pull-down unit comprises:
   a third switch including:
      a first end coupled to the output end;
      a second end for receiving a bias voltage; and
      a control end coupled to the second node.

5. The shift register of claim 1 wherein:
   the input circuit comprises:
      a first switch including:
         a first end for receiving the first clock signal;
         a second end coupled to the first node; and
         a control end coupled to the input end of the shift register unit;
   the pull-up circuit comprises:
      a second switch including:
         a first end for receiving the second clock signal;
         a second end coupled to the output end; and
         a control end coupled to the first node;
   the pull-down unit further comprises:
      a third switch including:
         a first end coupled to the output end;
         a second end for receiving a bias voltage; and
         a control end coupled to the second node; and
   the control circuit comprises:
      a fifth switch including:
         a first end for receiving the first clock signal;
         a second end coupled to the second node; and
         a control end coupled to the first end of the fifth switch;
      a sixth switch including:
         a first end for receiving the second clock signal;
         a second end coupled to the second node; and
         a control end coupled to the first end of the sixth switch; and a seventh switch including:
  a first end coupled to the second node;
  a second end for receiving the bias voltage; and
  a control end coupled to the first node.

6. The shift register of claim 5 wherein the control circuit further comprises:
an eighth switch including:
  a first end coupled to the second node;
  a second end for receiving the bias voltage; and
  a control end coupled to the control end of the seventh switch.

7. The shift register of claim 1 wherein the input end of the shift register unit is coupled to an output end of a prior-stage shift register unit for receiving the input signal.

8. A shift register comprising a plurality of shift register units coupled in series, each shift register unit comprising:
an input end for receiving an input voltage;
an output end for outputting an output voltage;
a first node;
a second node;
an input circuit for controlling a signal transmission path between a first clock signal and the first node according to a voltage level of the input voltage;
a pull-up circuit for providing the output voltage by controlling a signal transmission path between a second clock signal and the output node according to a voltage level of the first node, wherein the first and second clock signals periodically switch between a high voltage level and a low voltage level, and have opposite polarities in a same period; and
a pull-down circuit comprising:
  a pull-down unit for maintaining the voltage level of the first node or the output end according to a voltage level of the second node; and
  a control unit for maintaining the voltage level of the second node according to the first clock signal, the second clock signal and the voltage level of the first node, the control unit comprising:
    a fifth switch including:
      a first end for receiving the first clock signal;
      a second end coupled to the second node; and
      a control end coupled to the first end of the fifth switch;
    a sixth switch including:
      a first end for receiving the second clock signal;
      a second end coupled to the second node; and
      a control end coupled to the first end of the sixth switch; and
    a seventh switch including:
      a first end coupled to the second node;
      a second end for receiving a bias voltage; and
      a control end coupled to the first node.

9. The shift register of claim 8 wherein the control circuit further comprises:
an eighth switch including:
  a first end coupled to the second node;
  a second end for receiving the bias voltage; and
  a control end coupled to the control end of the seventh switch.

* * * * *